United States Patent [19]
Strantz, Jr.

[11] Patent Number: 5,112,491
[45] Date of Patent: May 12, 1992

[54] MANAGEMENT OF WASTE SOLUTION CONTAINING PHOTORESIST MATERIALS

[75] Inventor: John W. Strantz, Jr., Wilmington, Del.

[73] Assignee: E. I. Du Pont de Nemours and Company, Wilmington, Del.

[21] Appl. No.: 663,004

[22] Filed: Mar. 1, 1991

[51] Int. Cl.⁵ .............................................. B01D 61/00
[52] U.S. Cl. .................................... 210/651; 210/653; 210/654; 210/500.38; 210/500.37
[58] Field of Search ............... 210/651, 650, 639, 737, 210/195.2, 181, 653, 500.38, 500.37, 654

[56] References Cited

U.S. PATENT DOCUMENTS

| | | | |
|---|---|---|---|
| 4,294,704 | 10/1981 | Daniel et al. | 210/651 |
| 4,786,417 | 11/1988 | Miki et al. | 210/639 |
| 4,938,872 | 7/1990 | Strantz, Jr. et al. | 210/639 |

FOREIGN PATENT DOCUMENTS 3294989 12/1988 Japan ................................. 210/639

OTHER PUBLICATIONS

The Desal 5 Membrane, Desalination Systems Inc., Feb. 1989.

*Primary Examiner*—W. Gary Jones
*Assistant Examiner*—Ana M. Fortuna
*Attorney, Agent, or Firm*—Charles E. Krukiel

[57] ABSTRACT

The present invention relates to management of photoresist-resin-containing waste solution by feeding non-aged waste to a membrane device having a Desal-5 piperazine-based membrane modified to increase MWCO for uncharged organic molecules sufficiently so that, on a weight basis, alkalizing agent passage is greater than 90%, photoresist material rejection is essentially complete, color rejection is greater than 95% and COD rejection is greater than 80% to produce a clean permeate solution that can be recycled and a concentrate to be removed.

19 Claims, No Drawings

MANAGEMENT OF WASTE SOLUTION CONTAINING PHOTORESIST MATERIALS

FIELD OF THE INVENTION

The present invention relates to management of a photoresist resin containing waste solution discharged from printed circuit boards manufacturing process, printing industries, semiconductor manufacturing industry and the other industries using photoresist materials. Particularly, it relates to treatment of photoresist resin containing waste solution so as to regerate a developing solution or a stripping solution to be recycled. The inventive process comprises feeding a waste stream to a membrane device to produce a clean permeate solution that can be recycled and a concentrate to be removed.

BACKGROUND

Photoresist is used for the production of circuit patterns on a printed circuit boards, of printing matrices for the printing industry, of semiconductor patterns on semiconductor devices, and of a variety of patterns used on various electronic devices.

A photoresist is a photosensitive material that is applied over a support or a substrate. A phototool or mask defining a pattern desired is applied over the photoresist. Exposing a negative-working photoresist through the mask to radiation such as ultraviolet light results in a pattern of hardened polymer where exposed (the effect of exposing positive-working photoresists would differ). The non-hardened photoresist in either case is then removed in a developing process leaving a pattern of hardened polymer. The areas of substrate not covered by the hardened polymer are then etched or coated with metal depending on the end product desired. The hardened polymer then is removed in a stripping process.

Materials used in this process for production of patterns on a substrate may include polymers to form photoresist mask or layer, photosensitive monomers or oligomers to act as a cross-linking agents, photo-polymerization initiators, stabilizers if necessary, and coloring agents. The polymers to form photoresist mask or layer may have acrylic acid ester, methacryl acid, itaconic acid and maleic acid as a copolymerizable component, and, further, carboxyl group as a side chain. The cross-linking agents may be monomers or oligomers which may have acryloyl groups or methacryloyl groups. The photo-polymerization initiator may be an anthraquinone analogue, benzophenone analogue, and benzoyl-ether analogue. The stabilizer may be hydroquinone. The coloring agent may be a dye stuff such as blue coloring matter and green coloring matter.

Waste solution discharged from the developing process and the stripping process of a printed-circuit board manufacturing process is an alkaline solution containing water-soluble photoresist material at the high concentration, and therefore, high chemical oxygen demand (COD), for example, 20,000 to 30,000 milligrams per liter (mg/l) and high Biological Oxygen Demand (BOD), for example, 1,000 to 4,000 mg/l. Before discharging such a waste solution to the environment, the solution must be treated to remove organics.

U.S. Pat. No. 4,786,417, incorporated herein by reference, teaches a process for removing the organics from the photoresist-containing solutions discharged respectively from developing and stripping and treating processes. Ultrafiltration membranes having specific characteristics are employed to concentrate and remove photoresist and other materials, allowing a clean permeate in each case to pass through the ultrafiltration membrane. The permeate in each case is pH adjusted before being recycled to the treating process from which it originated. Concentrated photoresist materials can be polymerized to form the solidified substance. Exposure to the electromagnetic radiation, such as sunlight, or/and subjection to heat energy can be used to accelerate polymerization of the photoresist material dissolved in the waste solution to thereby produce the solid of the polymerized (or cured) material.

Typical developing solutions may be aqueous solutions of 1 to 2 weight percent (wt %) sodium carbonate ($Na_2CO_3$) containing 0.1 to 0.5 volume percent (vol %) of polyalkylene glycol as an antifoamer. They have a pH of about 10 to 11.5. Typical stripping solutions may be aqueous solutions of 1 to 5 wt % sodium hydroxide (NaOH) or potassium hydroxide (KOH), containing 0.1 to 0.5 vol % of polyalkylene glycol as an antifoamer plus various proprietary additives. They have a pH of about 13 to 13.5. As the developing solution or stripping solution is used, the $Na_2CO_3$, NaOH or KOH, as the case may be, is depleted and photoresist material is dissolved. Periodically, the alkalizing agent must be replenished and waste solution containing the soluble photoresist materials must be purged.

U.S. Pat. No. 4,786,417 subjects the waste solution to ultrafiltration employing an ultrafiltration membrane having a cut-off molecular weight of 5,000 to 100,000. The patent indicates that the dissolved photoresist materials are densified or concentrated from about 1.5 wt % to a range of about 15 wt % to 30 wt % and the inorganic alkalizing agent is not concentrated any more, and the content thereof in the concentrated waste solution is as much as 1 to 2 %.

In general, membrane systems have been found to not adequately remove the color and to foul quickly, especially when exposed to non-aged waste solution. By non-aged waste solution, it is meant solution that is not exposed to sufficient sunlight or similar radiation after being removed from the developing or stripping solution. Typically, non-aged or fresh waste is that which exists when there are fewer than about eight hours between removal and filtration, but, if the waste is kept sealed in a container that prevents sunlight from contacting it, it behaves as fresh waste.

SUMMARY OF INVENTION

It has now been found that the problems experienced with membrane systems can be remedied by employing the membrane of the present invention in place of the ultrafiltration membranes taught in the art. The preferred membrane used in the present invention is a Desal-5 membrane developed and marketed by Desalination Systems, Inc. (DSI) which is opened and stabilized by the technique described in U.S. Pat. No. 4,938,872, which is incorporated herein by reference.

DETAILED DESCRIPTION OF INVENTION

In accord with the present invention, photoresist-containing waste solution, which is to be understood herein as being either from the developing process or the stripping process of a photoimaging process such as used in manufacturing printed-circuit boards, is subjected to membrane separation. In a continuous developing or stripping process, the waste solution to be treated is a purge which is removed periodically and replaced with fresh developing or stripping solution, as the case may be. In a batch developing or stripping process, the waste solution may be the entire spent solution which is replaced with fresh after it becomes sufficiently fouled with photoresist polymer.

The waste solution is fed to a feedside of a membrane supported in a manner to separate the feedside from a permeate side. Sufficient pressure is applied across the membrane to cause a permeate stream to pass through the membrane leaving a concentrate or retentate stream on the feedside of the membrane. The permeate preferably is returned or recycled to the developing or the stripping process, as the case may be. That is, if the waste solution is from a developing process, the permeate would be returned to the developing process, and, if it is from a stripping process, the permeate would be returned to the stripping process.

It has been found that by aging the waste solution prior to feeding it to a membrane device that superior performance is achieved. In particular, fouling is inhibited allowing for greater flux (permeate flow through a unit area of membrane) and longer service life. Also, COD and color passage are lower with aged solution. By aging, it is meant that the waste solution is exposed to sunlight, preferably for more than 24 hours. It is believed that the ultraviolet (UV) light present in sunlight provides the aging effect discovered. A wide selection of membranes may be used if the waste solution is aged. These membranes include, but are not limited to, polyamide membranes, such as Du Pont's Permasep® A-15 membranes, and polysulfone membranes, such as Osmonic's PT1 membranes.

With non-aged solution, however, it has been found that some membranes, even with the 5,000 MWCO taught in U.S. Pat. No. 4,786,417, have a lower flux and foul much more quickly than those of this invention which have substantially smaller MWCO's. When the membranes foul, flux decreases and COD and color passage increase. It has been found that the membranes of this invention surprisingly resist fouling for an extended period of time. They provide surprisingly high flux for the salt passage obtained. One skilled in the art, based on the teachings herein, should be able to find, through routine experimentation, other membranes that, when opened, exhibit the fouling resistance with fresh solution and provide the separation, salt passage, flux and other properties of the membranes of this invention. These would be considered as equivalents.

The membrane of this invention is a membrane modified by the process described in U.S. Pat. No. 4,938,872. Generally the treatment described in U.S. Pat. No. 4,938,872 involves applying a dilute aqueous solution of an alkali metal permanganate, such as an aqueous solution containing 0.02 to 0.5 wt % alkali metal permanganate to the membrane for from 30 minutes to 5 hours or more for the asymmetric membranes and as little as 30 seconds for the composite membranes. Generally the pH should be adjusted to 2.3–3.0 for the asymmetric type membranes with higher but still acidic pH's being preferred for the composite type membranes. Treatment at pH 7 or above tends to be slower but is satisfactory for use with composite membranes. There is a tendency to leave a brown deposit on the membrane, particularly when using a pH above 7. The brown deposit can be removed by flushing with alkali metal bisulfite or hydrogen peroxide. Sulfuric acid is preferred to adjust the pH, but other acids such as hydrochloric acid can be used. Generally the solution is circulated through the membrane at 50–100 psig (345–690 kPa). The pressure does not appear to be critical, but sufficient pressure is desirable to obtain some permeate flow to permit measurement of permeate conductivity. This allows a determination of when to end the permanganate treatment to achieve the desired final salt passage. The membranes can be opened by a static exposure to the solution, but determining the end point is more difficult and the process requires more time (for the asymmetric membrane).

The amount of alkali metal permanganate used is more a function of the surface area of the membrane being treated than concentration of the solution being used. The alkali metal permanganate is consumed during the treatment and enough must be present to bring about the desired opening of the membrane. Generally the concentration of alkali metal permanganate is from 0.2 to 5 grams per liter (g/l). The concentration of alkali metal permanganate used is not particularly critical. However, alkali metal permanganate is consumed by the process, so when using very dilute concentrations of alkali metal permanganate enough solution must be used so that the desired amount of opening of the membrane can be achieved. At very high concentrations of alkali metal permanganate, and particularly when using a low pH, control of the desired amount of opening of the membrane can become difficult, since the amount of opening is very time dependent.

After the permanganate treatment, preferably the membrane is flushed with water to remove excess permanganate from the module. After the water flush the membrane is stabilized by treatment with a dilute aqueous solution of alkali metal bisulfite or dilute aqueous solution of hydrogen peroxide which preferably is an aqueous solution of 0.25 to 5 wt % alkali metal bisulfite or 0.01 to 0.1 wt % hydrogen peroxide. The bisulfite treatment is preferred. After stabilization a final water flush is performed.

It has been found that the preferred membrane to be modified is Desal-5 membrane. This membrane is a thin-film membrane developed and marketed by Desalination Systems, Inc. (DSI). It falls into the overlap region between reverse osmosis and ultrafiltration with an approximate MWCO of 100 to 150 for uncharged organic molecules. The Desal-5 membrane is believed to be a piperazine-based membrane. Untreated Desal-5 membrane typically has a salt passage on NaCl solution of 40 to 50 wt %.

The membranes of the present invention preferably are opened to salt (NaCl) passages of 80 wt % or more, preferably about 95 wt %. The preferred membranes, at the same time, reject 80 wt % to 95 wt % of the chemical oxygen demand (COD) and 90 wt % to 100 wt %, preferably 95 wt % to 98 wt % of the color associated with the spent photoresist polymers in the waste solution. It is believed that much of the COD not rejected is the antifoam agent which is generally required in developer and stripper processes. At least 50% to as much as 80% of the antifoam agent passes through the membrane and can be recycled to the developer or stripper solution as the case may be.

The molecular weight cut-off (MWCO) of the opened membrane is significantly less than the 5,000 to 100,000 MWCO ultrafiltration membranes of U.S. Pat. No. 4,786,417. Preferably, the MWCO is greater than 150 and is less than 1,000.

EXAMPLES

The waste solution used in the following examples was spent developer solution obtained from a process in which Riston ® 3100 film was developed using 1 wt % sodium carbonate and 10 milliliters per gallon of anti-foaming agent (Du Pont FoamFREE ™ 940) in an aqueous solution. The pH of the waste was about 10. It was kept in a plastic drum, not exposed to light.

EXAMPLE 1

The treated flat Desal-5 membrane of this example was opened by first soaking it for 1 hour in a 1 gram of $KMnO_4$ per gallon of water (0.25 wt % aqueous solution) at a pH adjusted to about 2.5 with sulfuric acid followed by rinsing in water. The treated membrane was then stabilized by soaking for sufficient time to remove the brown color evident after treating with $KMnO_4$ (about 15 minutes) in a 1 wt % aqueous solution of sodium bisulfite. It was then washed in water to remove the sodium bisulfite.

The treated membrane was installed in a flat cell tester holder. The surface area of the membrane in the cell was about 12.5 square inches. The membrane was initially characterized by feeding a sodium chloride solution having a conductivity of about 1500 micro-Siemens per cm ($\mu$S/cm) at 25° C., which is the conductivity of about 750 ppm NaCl in process water, to the cell. The temperature of the feed varied from 18.9° to 21.6° C. and the feed pressure was maintained at 100 pounds per square inch gauge (psig) at a reject flow of 0.86 gallons per minute (gpm) during this characterization. Based on conductivity measurements and permeate and reject flow measurements, a salt passage of 56.9% and a permeate flow of 0.00254 gpm at 25° C. were calculated.

Non-aged Riston ® film waste solution was then fed to the cell tester at 100 psig and a temperature ranging from 21° to 24° C. The reject flow was about 0.86 gpm.

Based on conductivity and flow measurements, salt passage and permeate flow after about 5 minutes of operation were calculated to be 84.3% and 0.00254 gpm at 25° C., respectively. The permeate was clear. After 2¼ hours, the salt passage was calculated to be 87.2% and the permeate flow was 0.00158 gpm at 25° C. The COD in the feed was 36,250 mg/l. The COD in the permeate was 6500 mg/l.

At the conclusion of the Riston ® film test, the cell was flushed with sodium chloride solution and characterized again using sodium chloride solution as was originally done. The salt passage was calculated to be 62.7% and the permeate flow to be 0.00256 gpm at 25° C.

EXAMPLE 2

A nominally 2½ inch outside diameter by 24 inch long spirally wound DSI Desal 5 DK2524 cartridge containing approximately 14 square feet of membrane was first characterized by feeding it with a 1500 $\mu$S/cm NaCl aqueous solution at 22.5° C. and 100 psig. The salt passage was calculated to be 60% and the permeate flow was 0.158 gpm at 25° C.

The cartridge was then treated using the process taught in U.S. Pat. No. 4,938,872. Ten grams of potassium permanganate dissolved in 10 gallons of water was added to the feed solution. The feed solution was circulated through the cartridge for one hour at 24.4° C. and initially at 50 psig and, for the last 18 minutes, at 70 psig. The pH was adjusted to about 2.5 and maintained at the pH by adding sulfuric acid. The feed solution was drained and 1 pound of sodium bisulfite dissolved in 10 gallons of water was flushed through the cartridge at 100 psig at a permeate flow rate of 0.182 gpm. The cartridge was then flushed with process water and then characterized by feeding it with a 1500 $\mu$S/cm NaCl aqueous solution at 21.2° to 26.3° C. and 100 psig. at about 10% conversion. It was then flushed with water and shut down. The salt passage was calculated to be 61.5% and the permeate flow was 0.293 gpm at 25° C.

This specially treated cartridge was then tested using non-aged Riston ® film developer waste solution. About 14 gallons of non-aged waste was circulated through the cartridge at 100 psig and about 21° to 25° C. at a conversion (permeate flow divided by feed flow) of about 7% for 3½ hours with both the permeate and the retentate being returned to the feed tank. Permeate was clear. COD in the permeate was 2550 ppm.

After the 3½ hours, a concentration test was run by collecting permeate as shown in the following table. Feed pressure was maintained at about 100 psig and temperature was about 25° C. Permeate remained clear. Average permeate flow and the volume percent (vol %) reduction in feed following each permeate sample withdrawal are shown in the following table:

| Time (minutes) | Cumulative Perm. Collected (liters) | Avg. Permeate Flow (gpm) | Vol % Reduction in Feed |
| --- | --- | --- | --- |
|  | 2 | 0.0755 | 3.9 |
| 7:00 | 4 | 0.0755 | 7.7 |
| 14:35 | 6 | 0.0697 | 11.6 |
| 22:00 | 8 | 0.0712 | 15.4 |
| 29:44 | 10 | 0.0683 | 19.3 |
| 37:40 | 12 | 0.0666 | 23.2 |
| 45:55 | 14 | 0.0640 | 27.0 |
| 54:29 | 16 | 0.0617 | 30.9 |
| 63:26 | 18 | 0.0590 | 34.7 |
| 72:49 | 20 | 0.0563 | 38.6 |
| 82:55 | 22 | 0.0523 | 42.4 |
| 93:34 | 24 | 0.0496 | 46.3 |
| 104:42 | 26 | 0.0475 | 50.1 |
| 116:33 | 28 | 0.0445 | 54.0 |
| 129:49 | 30 | 0.0399 | 57.9 |
| 144:40 | 32 | 0.0356 | 61.7 |

After 144:40 minutes, concentration was stopped and system was allowed to circulate for about 10 minutes. Feed pressure was then raised to 150 psig. Salt passage was calculated to be 48.55% and the permeate flow was 0.0349 gpm at 25° C. After about 10 more minutes, feed pressure was increased to 200 psig. Salt passage was calculated to be 38.91% and the permeate flow was 0.0646 gpm at 25° C. Pressure was reduced to 100 psig, and after about 10 minutes, salt passage was calculated to be 45.96% and the permeate flow was 0.0309 gpm at 25° C.

The cartridge was flushed with process water and drained. It was re-characterized with 1500 $\mu$S/cm sodium chloride solution at 100 psig and 10% conversion. Salt passage was calculated to be 62.8% and permeate flow was 0.316 gpm at 25° C.

EXAMPLE 3

The cartridge used in Example 2 was retreated with potassium permanganate to open it further. The cartridge was soaked in 25 grams of potassium permanganate in 23 gallons of water, pH adjusted with sulfuric acid to pH 2.45. After one hour, the treating solution was drained and the cartridge was soaked in 2½ pounds of sodium bisulfite in 25 gallons of water for about 20 minutes. The cartridge was flushed with process water to remove sodium bisulfite. It was then characterized using 1500 μS/cm sodium chloride solution as before, but at about 11.2% conversion. After 10 minutes, salt passage was calculated as 77.2% and permeate flow as 0.469 gpm at 25° C. After another 10 minutes, salt passage was calculated as 77.0% and permeate flow as 0.455 gpm at 25° C.

As in Example 2, the membrane of Example 3 was tested. Feed solution was the Riston® film developer solution concentrated to about 62% in Example 2. The Riston® film waste solution was stored in the dark to avoid aging. Permeate was clear but with a slight yellow cast. Salt passage and permeate flow calculated while the system was recycling retentate and permeate back to the feed are reported in the following table:

| Time (minutes) | Salt passage (%) | Permeate Flow (gpm) |
|---|---|---|
| 10 | 84.45 | 0.0731 |
| 30 | 85.25 | 0.0766 |
| 85 | 83.94 | 0.0764 |
| 90 | 85.95 | 0.0743 |

As in Example 2, a concentration test was then run by collecting permeate as shown in the following table. Feed pressure was maintained at about 100 psig and temperature was about 25° C. Permeate remained clear, but yellowish. Average permeate flow and the volume percent (vol %) reduction in feed following each permeate sample are shown in the following table:

| Time (minutes) | Cumulative Perm. Collected (liters) | Avg. Permeate Flow (gpm) | Vol % Reduction in Feed |
|---|---|---|---|
| 7:03 | 2 (total 34) | 0.0754 | 65.6 |
| 14:49 | 4 (total 36) | 0.0680 | 69.4 |
| 23:36 | .6 (total 38) | 0.0602 | 73.3 |
| 33:33 | 8 (total 40) | 0.531 | 77.2 |
| 37:00 | 0.62 (total 40.62) | * | 78.3 |

* test discontinued due to low tank level

After shutdown and flushing with process water, the cartridge was recharacterized with 1500 μS/cm NaCl solution at 100 psig and 10% conversion. Salt passage was calculated as 77.9 and permeate flow was 0.441 gpm at 25° C.

EXAMPLE 4

The flat membrane of Example 1 was tested to determine performance compared to an Osmonic's PT1 membrane known to have a MWCO of 1000. A 1500 μS/cm sodium chloride solution or a dye solution, as indicated in the following table, was fed to a flat film tester as in Example 1. Pressure was maintained at 100 psig and temperature at about 25° C. Salt passage is calculated based on the conductivity of Na+ and dye passage is calculated based on apparent color as measured with a Hach DR3 Spectrophotometer. Test solutions were run in the order indicated.

Unlike the membrane of Example 1, the Osmonic's PT1 membrane had unsatisfactory performance when non-aged waste solution was fed to it. When characterized with 1500 μS/cm NaCl solution at 100 psig, the permeate flow was 0.0107 gpm at 25° C. When recharacterized after only 13 minutes of operation with non-aged Riston® film waste solution as in Example 1, the permeate flow had decreased almost 22 times to 0.000491 gpm at 25° C.

| | Treated Desal-5 | | Osmonic's PT1 | |
|---|---|---|---|---|
| Test Solution | Permeate Flow (gpm) | Salt or Dye Passage (%) | Permeate Flow (gpm) | Salt or Dye Passage (%) |
| NaCl (1500 μS/cm) | 0.0123 | 87.8 | 0.0191 | 94.8 |
| Alcian Blue 8GX (1299 MW) 100 mg/l. pH = 4.1 | 0.0120 | 0.0 | 0.128 | 3.3 |
| NaCl (1500 μS/cm) | 0.0108 | 90.5 | 0.0087 | 94.2 |
| Alcian Blue 8GX 1000 mg/l. pH = 3.3 | 0.0069 | 0.0 | 0.0064 | 0.6 |
| Alcian Blue 8GX 1000 mg/l. pH = 9.0 | 0.0082 | 0.3 | — | — |
| Alcian Blue 8GX 1000 mg/l. pH = 3.8 | 0.0087 | 0.0 | — | — |
| NaCl (1500 μS/cm) | 0.0088 | 88.3 | 0.0085 | 96.0 |
| Chicago Sky Blue (993 MW) 100 mg/l. pH = 6.2 | 0.0075 | 8.8 | 0.0079 | 0.5 |
| Chicago Sky Blue 100 mg/l. pH = 3.2 | 0.0062 | 0.7 | — | — |
| Chicago Sky Blue 100 mg/l. pH = 1.8 | 0.0069 | 5.7 | 0.0037 | 4.0 |
| Chicago Sky Blue 100 mg/l. pH = 10.9 | 0.0055 | 53.3 | 0.0050 | 11.4 |
| NaCl (1500 μS/cm) | 0.0087 | 96.0 | 0.0080 | 92.6 |

I claim:

1. A process for removing photoresist material, color and COD from a non-aged waste solution obtained from the treatment of photoresist material by a treating solution containing an alkalizing agent and an antifoam agent comprising feeding the non-aged waste solution to the feedside of a membrane at sufficient pressure to cause a permeate to pass through the membrane, the membrane being a thin-film piperazine-based membrane modified to increase MWCO for uncharged organic molecules sufficiently so that, on a weight basis, alkalizing agent passage is greater than 90 percent, photoresist material rejection is essentially complete. color rejection is greater than 95 percent and COD rejection is greater than 80 percent.

2. The process of claim 1 wherein greater than 50 weight percent of the antifoam agent present in the treating solution passes through the membrane into the permeate.

3. The process of claim 2 further comprising returning the permeate to the treating solution for use in the photoresist-material-treating process.

4. The process of claim 3 wherein the treating process is a developing process.

5. The process of claim 4 wherein the treating process is a continuous process and the waste-solution feed to the feedside of the membrane comprises a purge from the continuous treating process.

6. The process of claim 3 wherein the treating process is a stripping process.

7. The process of claim 6 wherein the treating process is a continuous process and the waste-solution feed to the feedside of the membrane comprises a purge from the continuous treating process.

8. The process of claim 1 further comprising returning the permeate to the treating solution for use in the photoresist-material-treating process.

9. The process of claim 8 wherein the treating process is a developing process.

10. The process of claim 9 wherein the treating process is a continuous process and the waste-solution feed to the feedside of the membrane comprises a purge from the continuous treating process.

11. The process of claim 8 wherein the treating process is a stripping process.

12. The process of claim 11 wherein the treating process is a continuous process and the waste-solution feed to the feedside of the membrane comprises a purge from the continuous treating process.

13. The process of claim 1 wherein the treating process is a developing process.

14. The process of claim 13 wherein the treating process is a continuous process and the waste-solution feed to the feedside of the membrane comprises a purge from the continuous treating process.

15. The process of claim 1 wherein the treating process is a stripping process.

16. The process of claim 15 wherein the treating process is a continuous process and the waste-solution feed to the feedside of the membrane comprises a purge from the continuous treating process.

17. A process for removing photoresist material, color and COD from waste solution obtained from the treatment of photoresist material by a treating solution containing an alkalizing agent comprising first aging the waste solution for a sufficient time and then feeding the aged waste to a feedside of a polyamide membrane at sufficient pressure to cause a permeate to pass through the membrane wherein the membrane has a sufficiently large MWCO for uncharged organic molecules so that, on a weight basis, alkalizing agent passage is greater than 90 percent, photoresist material rejection is essentially complete, color rejection is greater than 95 percent and COD rejection is greater than 80 percent.

18. The process of claim 17 wherein the waste solution was aged at least 24 hours.

19. A process for removing waste materials comprising photoresist, color and COD from a spent treating solution containing an alkalizing agent and an antifoam agent which comprises passing said spent treating solution through a modified thin-film piperazine-based membrane at a pressure whereby at least 90 percent of the alkalizing agent and at least 50 percent of the antifoam agent passes through the membrane, substantially all of the photoresist is rejected and at least 95 percent of the color and at least 80 percent of the COD are rejected.

* * * * *